United States Patent
Koike

(10) Patent No.: US 9,472,591 B2
(45) Date of Patent: *Oct. 18, 2016

(54) SEMICONDUCTOR IMAGE PICKUP DEVICE

(71) Applicant: KABUSHIKI KAISHA TOSHIBA, Minato-ku (JP)

(72) Inventor: Hidetoshi Koike, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/950,884

(22) Filed: Nov. 24, 2015

(65) Prior Publication Data

US 2016/0079299 A1 Mar. 17, 2016

Related U.S. Application Data

(63) Continuation of application No. 14/671,533, filed on Mar. 27, 2015, now Pat. No. 9,240,430, which is a continuation of application No. 13/232,260, filed on Sep. 14, 2011, now Pat. No. 9,048,156.

(30) Foreign Application Priority Data

Nov. 10, 2010 (JP) ................. 2010-251801

(51) Int. Cl.
*H01L 31/04* (2014.01)
*H01L 27/146* (2006.01)
(Continued)

(52) U.S. Cl.
CPC ... *H01L 27/14643* (2013.01); *H01L 21/76829* (2013.01); *H01L 23/53228* (2013.01);
(Continued)

(58) Field of Classification Search
None
See application file for complete search history.

(56) References Cited

U.S. PATENT DOCUMENTS 7,193,289 B2 3/2007 Adkisson et al.
7,402,881 B2 * 7/2008 Kuwazawa ....... H01L 27/14632
257/292

(Continued)

FOREIGN PATENT DOCUMENTS

JP 2004-311902 A 11/2004
JP 2007-128979 5/2007
(Continued)

OTHER PUBLICATIONS

Taiwanese Office Action issued Nov. 22, 2013, in Taiwanese Patent Application No. 100132638 (with English-language translation).
(Continued)

*Primary Examiner* — Ali Naraghi
(74) *Attorney, Agent, or Firm* — Oblon, McClelland, Maier & Neustadt, L.L.P.

(57) ABSTRACT

According to one embodiment, a semiconductor image pickup device includes a pixel area and a non-pixel area. The device includes a first photoelectric conversion element formed in the pixel area, a first transistor formed in the pixel area and connected to the first photoelectric conversion element, a second photoelectric conversion element formed in the non-pixel area, a second transistor formed in the non-pixel area and connected to the second photoelectric conversion element, a metal wire formed at least in the non-pixel area, a first cap layer formed on the metal wire to prevent diffusion of metal contained in the metal wire, and a dummy via wire formed in the non-pixel area and penetrating the first cap layer.

11 Claims, 3 Drawing Sheets

(51) Int. Cl.
*H01L 21/768* (2006.01)
*H01L 23/532* (2006.01)

(52) U.S. Cl.
CPC ... *H01L23/53238* (2013.01); *H01L 27/14612* (2013.01); *H01L 27/14623* (2013.01); *H01L 27/14636* (2013.01); *H01L 27/14689* (2013.01); *H01L 27/1463* (2013.01); *H01L 27/14621* (2013.01); *H01L 27/14627* (2013.01); *H01L 2924/0002* (2013.01)

(56) References Cited

U.S. PATENT DOCUMENTS

| | | | |
|---|---|---|---|
| 7,932,120 | B2 | 4/2011 | Kim et al. |
| 2005/0087784 | A1 | 4/2005 | Lee et al. |
| 2006/0060899 | A1 | 3/2006 | Hong et al. |
| 2006/0163628 | A1 | 7/2006 | Mori et al. |
| 2008/0230861 | A1 | 9/2008 | Li et al. |
| 2008/0283893 | A1 | 11/2008 | Shih et al. |
| 2009/0108309 | A1* | 4/2009 | Park .......... H01L 27/14621 257/292 |
| 2009/0108389 | A1 | 4/2009 | Inoue |
| 2010/0025571 | A1 | 2/2010 | Toumiya et al. |
| 2010/0301444 | A1 | 12/2010 | Koike |
| 2011/0149137 | A1 | 6/2011 | Koike |
| 2012/0112253 | A1 | 5/2012 | Koike |
| 2015/0200225 | A1* | 7/2015 | Koike .......... H01L 27/14623 257/292 |

FOREIGN PATENT DOCUMENTS

| | | |
|---|---|---|
| JP | 2010-232284 A | 10/2010 |
| TW | 200701479 | 1/2007 |

OTHER PUBLICATIONS

Chinese Office Action issued Dec. 2, 2013, in Chinese Patent Application No. 201110272722.9 (with English-language translation).

Office Action issued Feb. 4, 2014 in Japanese Patent Application No. 2010-251801 (with English language translation).

Taiwanese Office Action issued Jul. 17, 2014 in Patent Application No. 100132638 (with English Translation).

Japanese Office Action dated Oct. 21, 2014, issued in Japanese Patent Application No. 2010-251801 (with English translation).

* cited by examiner

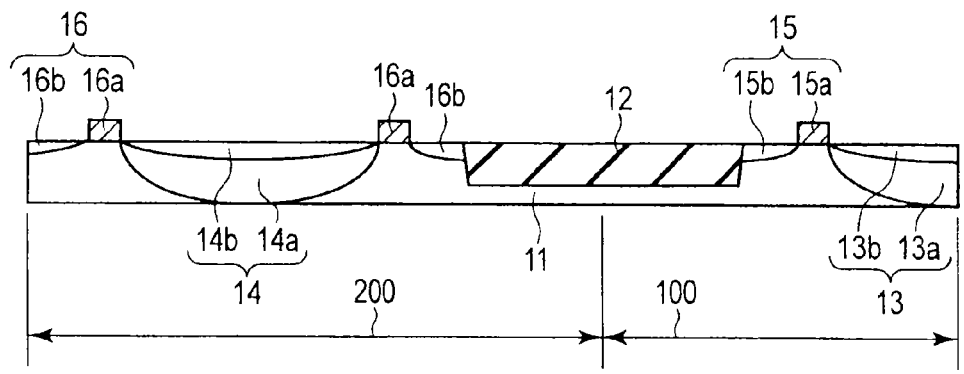
F I G. 3
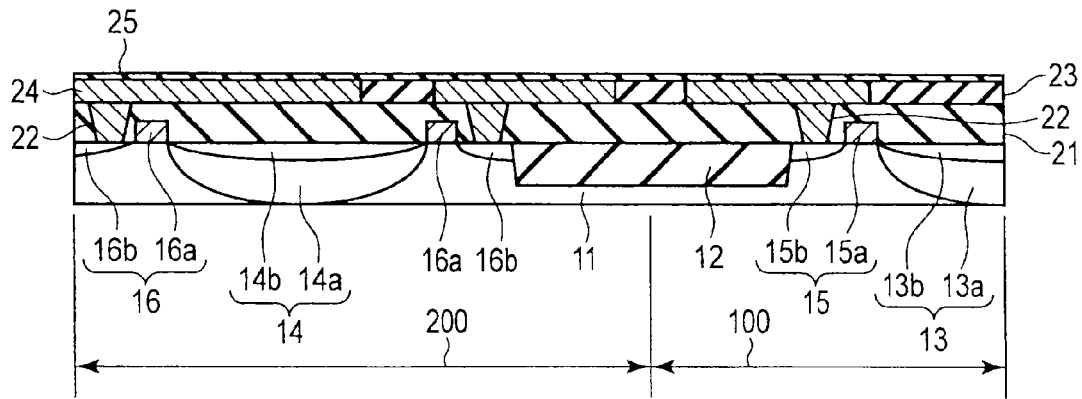
F I G. 4
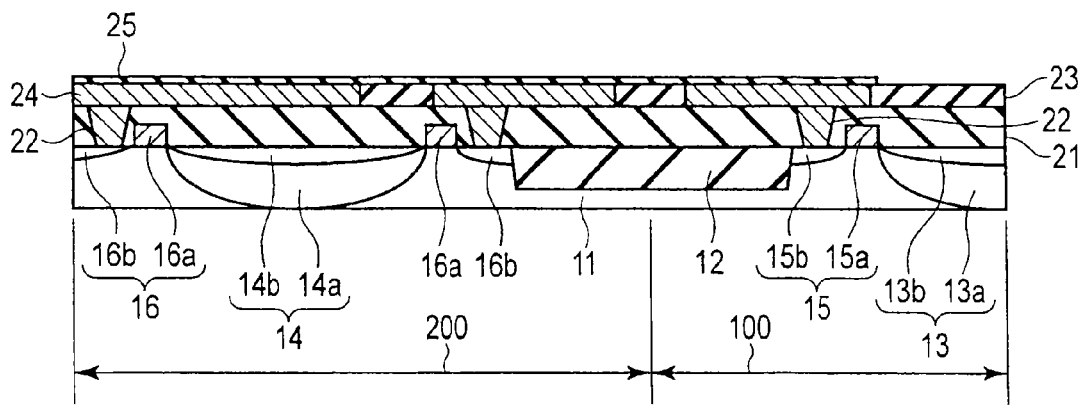
F I G. 5

SEMICONDUCTOR IMAGE PICKUP DEVICE

CROSS-REFERENCE TO RELATED APPLICATIONS

This application is based upon and claims the benefit of priority under 35 U.S.C. §120 from U.S. Ser. No. 14/671,533, filed Mar. 27, 2015 which is a continuation of U.S. Ser. No. 13/232,260, filed Sep. 14, 2011 now U.S. Pat. No. 9,048,156, which claims the benefit of priority from prior Japanese Patent Application No. 2010-251801, filed Nov. 10, 2010, the entire contents of which are incorporated herein by reference.

FIELD

Embodiments described herein relate generally to a semiconductor image pickup device.

BACKGROUND

Semiconductor image pickup devices such as CMOS image sensors are increasingly miniaturized and generally use copper (Cu) wires. When copper wires are used, a cap layer such as a silicon nitride film needs to be provided on the copper wire in order to prevent diffusion of the copper.

However, in a pixel area, a part of the cap layer which is located over a photoelectric conversion element is removed in order to suppress attenuation of light incident on the photoelectric conversion element. On the other hand, non-pixel areas such as a dummy pixel area and a black reference area do not require suppression of light attenuation. Thus, in these areas, the cap layer is not removed. Hence, during a sinter process, the amount of hydrogen supplied to a substrate differs between the pixel area and the non-pixel area. As a result, disadvantageously, a dark characteristic and the like may vary between the pixel area and the non-pixel area.

As described above, characteristic differences may conventionally occur between the pixel area and the non-pixel area, making production of excellent semiconductor image pickup devices difficult.

BRIEF DESCRIPTION OF THE DRAWINGS

FIG. 3 is a cross-sectional view schematically illustrating a part of a method for manufacturing a semiconductor image pickup device according to the embodiment;

FIG. 4 is a cross-sectional view schematically illustrating a part of the method for manufacturing a semiconductor image pickup device according to the embodiment;

FIG. 5 is a cross-sectional view schematically illustrating a part of the method for manufacturing a semiconductor image pickup device according to the embodiment;

DETAILED DESCRIPTION

In general, according to one embodiment, a semiconductor image pickup device includes a pixel area and a non-pixel area. The device includes a first photoelectric conversion element formed in the pixel area; a first transistor formed in the pixel area and connected to the first photoelectric conversion element; a second photoelectric conversion element; a second photoelectric conversion element formed in the non-pixel area; a second transistor formed in the non-pixel area and connected to the second photoelectric conversion element; a metal wire formed at least in the non-pixel area; a first cap layer formed on the metal wire to prevent diffusion of metal contained in the metal wire; and a dummy via wire formed in the non-pixel area and penetrating the first cap layer.

An embodiment will be described below with reference to the drawings.

Figure 1:
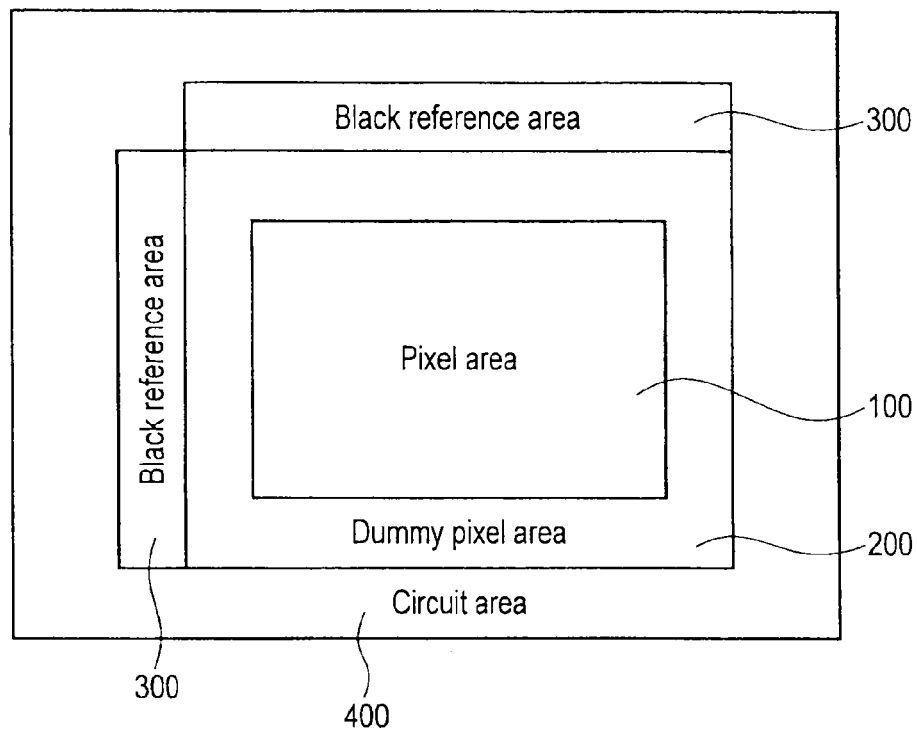
FIG. 1 is a diagram schematically showing a general configuration of a semiconductor image pickup device according to an embodiment.

FIG. 1 is a diagram schematically showing a general configuration of a semiconductor image pickup device (CMOS image sensor) according to the embodiment.

As shown in FIG. 1, the semiconductor image pickup device comprises a pixel area 100, a dummy pixel area 200, a black reference area 300, and a circuit area 400.

In the pixel area 100, a plurality of pixels are arranged in a matrix. A photo diode (photoelectric conversion element) and a MOS transistor are provided in each pixel. The dummy pixel area 200 is arranged around the periphery of the pixel area 100. The dummy pixel area 200 is not used for actual image pickup operations but is provided as required for a manufacturing process or the like. The black reference area 300 is configured to generate a black reference signal. In non-pixel areas such as the dummy pixel area 200 and the black reference area 300, photodiodes and MOS transistors are provided as is the case with the pixel area 100. A circuit area including an analog signal circuit and a digital signal circuit is arranged around the periphery of the dummy pixel area 200 and the black reference area 300.

Figure 2:
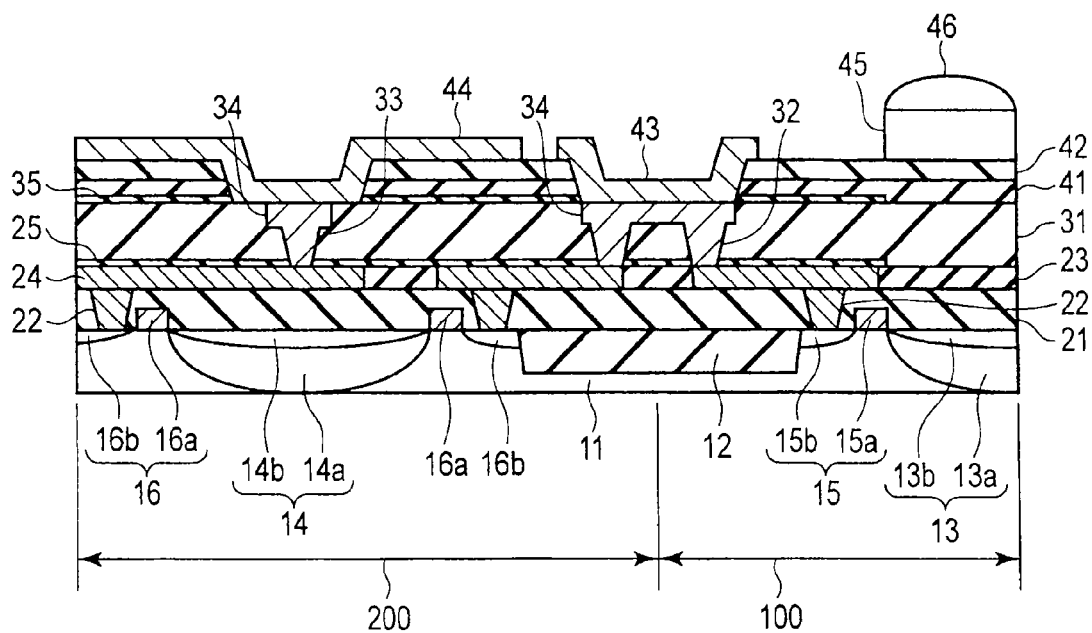
FIG. 2 is a cross-sectional view schematically showing a configuration of the semiconductor image pickup device according to the embodiment.

FIG. 2 is a cross-sectional view schematically showing a configuration of the semiconductor image pickup device (CMOS image sensor) according to the present embodiment. FIG. 2 shows the pixel area 100 on the right side thereof and the dummy pixel area 200 as a non-pixel area on the left side thereof.

As shown in FIG. 2, an isolation area 12 is formed in a surface area of a semiconductor substrate (silicon substrate) 11.

A photodiode 13 is formed in the pixel area 100 as a photoelectric conversion element. A photodiode 14 is formed in the dummy pixel area 200 as a photoelectric conversion element. The photodiode 13 comprises an N-type area 13a and a P-type area 13b. The photodiode 14 comprises an N-type area 14a and a P-type area 14b.

Furthermore, a transistor (MOS transistor) 15 is formed in the pixel area 100. Transistors (MOS transistors) 16 are formed in the dummy pixel area 200. The transistor 15 includes a gate electrode 15a and a source/drain diffusion area 15b. Each of the transistors 16 includes a gate electrode 16a and a source/drain diffusion area 16b. Furthermore, the transistor 15 is connected to the photodiode 13. The transistor 16 is connected to the photodiode 14.

An interlayer insulating film 21 is formed on the semiconductor substrate 11. Contact holes are formed in the interlayer insulating film 21. Contacts 22 comprising, for example, tungsten are formed in the respective contact holes.

An interlayer insulating film 23 is formed on the interlayer insulating film 21. Trenches are formed in the interlayer insulating film 23. Copper wires 24 are formed in the respective trenches as metal wires. The copper wires 24 are formed in the pixel area 100 and the dummy pixel area 200. However, in order to prevent light incident on the photodiodes 13 from being blocked, the copper wire 24 is not formed above the photodiodes 13 provided in the pixel area 100.

A cap layer (first cap layer) 25 formed of a silicon nitride film or a silicon carbide film is provided on the copper wires 24 and the interlayer insulating film 23 in order to prevent diffusion of copper contained in the copper wires 24. However, in order to prevent attenuation of light incident on the photodiodes 13, the cap layer 25 is not formed above the photodiodes 13 provided in the pixel area 100.

An interlayer insulating film 31 is formed on the interlayer insulating film 23 and the cap layer 25. Via holes are formed in the interlayer insulating film 31. Via wires 32 comprising copper is formed in the respective via holes. In the dummy pixel area 200, a dummy via wire 33 comprising copper is formed in a via hole. The dummy via wire 33 is not used for circuit operations. The dummy via wire 33 is connected to the copper wire 24 through the cap layer 25. Furthermore, a trench is formed in the interlayer insulating film 31. A copper wire 34 is formed in the trench. The via wire 32, the dummy via wire 33, and the copper wire 34 are formed in the same step as described below.

A cap layer (second cap layer) 35 formed of a silicon nitride film or a silicon carbide film is provided on the interlayer insulating film 31 in order to prevent diffusion of copper. However, in order to prevent attenuation of light incident on the photodiodes 13, the cap layer 35 is not formed above the photodiodes 13 provided in the pixel area 100.

A stack film of a silicon oxide film 41 and a silicon nitride film 42 is formed on the interlayer insulating film 31 and the cap layer 35 as a passivation film. Openings are formed in the passivation film and the cap layer 35. A bonding pad 43 connected to the copper wire 34 is formed in the opening formed in the pixel area 100. Furthermore, a light shielding film 44 is formed in the opening formed in the dummy pixel area and on the passivation film. Each of the bonding pad 43 and the light shielding film 44 is formed of an aluminum film. Here, in the dummy pixel area, an opening is formed above the dummy via wire 33. The interlayer insulating film 31 and the copper wire 34 are exposed from the opening formed in the dummy pixel area. The light shielding film 44 and the copper wire 34 are in contact with each other.

Furthermore, a color filter 45 is formed on the silicon nitride film 42. A micro lens 46 is formed on the color filter 45. The color filter 45 and the micro lens 46 are provided above the photodiode 13.

Now, a method for manufacturing a semiconductor image pickup device according to the present embodiment will be described with reference to FIG. 3 to FIG. 7 and FIG. 2.

First, as shown in FIG. 3, an isolation area 12 is formed on the semiconductor substrate (silicon substrate) 11. Moreover, a photodiode 13 and a transistor 15 are formed in the pixel area 100. A photodiode 14 and transistors 16 are formed in the dummy pixel area 200.

Then, as shown in FIG. 4, a silicon oxide film is deposited on the semiconductor substrate 11 as an interlayer insulating film 21. The interlayer insulating film 21 is flattened by CMP. Then, contact holes are formed in the interlayer insulating film 21 by photolithography. The contact holes are filled with tungsten to form contacts 22.

Then, a silicon oxide film is deposited as an interlayer insulating film 23. Subsequently, wiring trenches are formed in the interlayer insulating film 23 by photolithography. A copper film is deposited all over the surface of the interlayer insulating film 23 and then flattened by CMP. Thus, copper wires 24 are formed in the trenches as metal wires.

Then, a silicon nitride film is formed all over the resultant surface as a cap layer 25 in order to prevent diffusion of copper contained in the copper wires 24.

Then, as shown in FIG. 5, a part of the cap layer 25 which is located above the photodiode 13 in the pixel area 100 is removed in order to prevent attenuation of light incident on the photodiode 13 in the pixel area 100. The cap layer 25 is not removed in the dummy pixel area 200.

Figure 6:
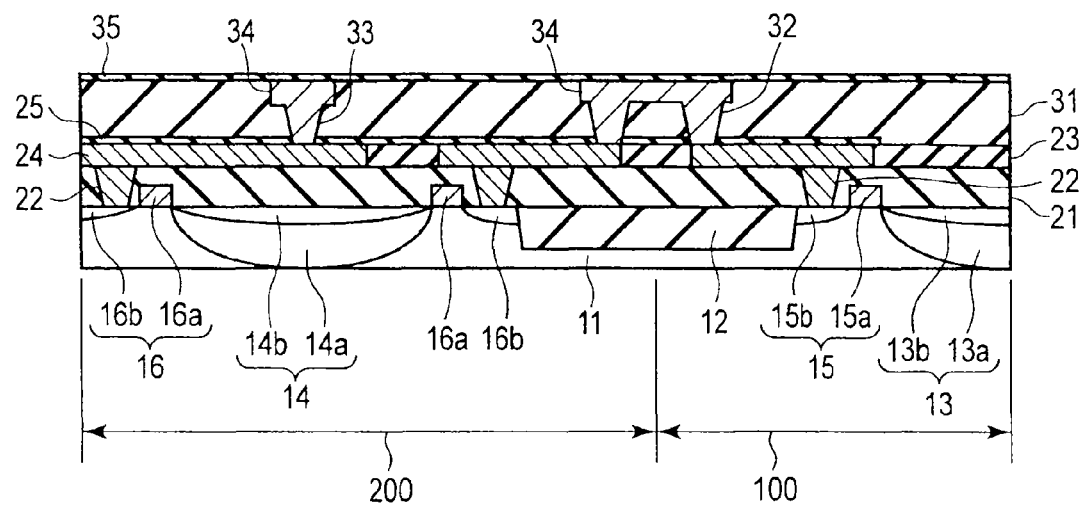
FIG. 6 is a cross-sectional view schematically illustrating a part of the method for manufacturing a semiconductor image pickup device according to the embodiment.

Then, as shown in FIG. 6, a silicon oxide film is deposited all over the resultant surface as an interlayer insulating film 31. Subsequently, via holes are formed in the cap layer 25 and the interlayer insulating film 31 by photolithography. Moreover, a wiring trench is formed in the interlayer insulating film 31 by photolithography. A copper film is deposited all over the resultant surface and then flattened by CMP. Thus, a via wire 32, a dummy via wire 33, and a copper wire 34 are formed.

Then, a silicon nitride film is formed all over the resultant surface as a cap layer 35 in order to prevent diffusion of copper contained in the copper wire 34.

Figure 7:
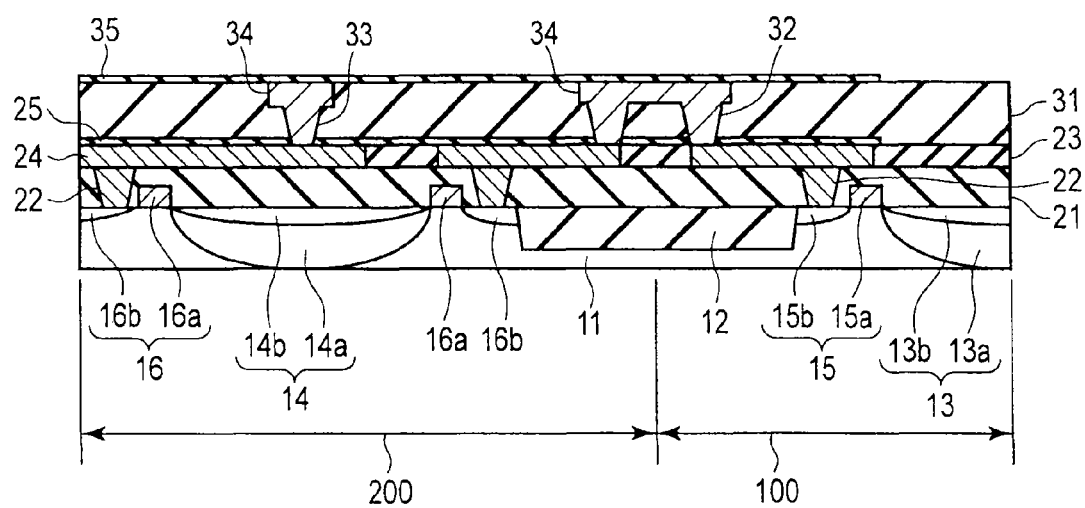
FIG. 7 is a cross-sectional view schematically illustrating a part of the method for manufacturing a semiconductor image pickup device according to the embodiment.

Then, as shown in FIG. 7, a part of the cap layer 35 which is located above the photodiode 13 in the pixel area 100 is removed in order to prevent attenuation of light incident on the photodiode 13 in the pixel area 100.

Then, as shown in FIG. 2, a stack film of a silicon oxide film 41 and a silicon nitride film 42 is formed all over the resultant surface as a passivation film. Subsequently, openings are formed in the silicon oxide film 41, the silicon nitride film 42, and the cap layer 35.

Then, an aluminum film is deposited all over the resultant surface. The aluminum film is patterned so as to form bonding pads 43 and a light shielding film 44.

Then, in a hydrogen gas atmosphere, the resultant structure is thermally treated at about 400° C. (sinter process). The sinter process diffuses hydrogen to the surface of the semiconductor substrate 11 so that dangling bonds at the interface between the semiconductor substrate 11 and a gate insulating film (not shown in the drawings) are terminated by the hydrogen.

During the sinter process, a dummy via wire 33 that fails to function in connection with circuit operations is formed in the dummy pixel area 200. The dummy via wire 33 allows a diffusion path for hydrogen to be reliably provided. That is, given that the dummy via wire 33 is not formed and that the copper wire 24 connected to the dummy via wire 33 is entirely covered with the cap layer 25, the cap layer 25 blocks the diffusion path for hydrogen. Thus, the amount of hydrogen supplied to the surface of the semiconductor substrate differs significantly between the pixel area 100 and the dummy pixel area 200. This significantly varies transistor characteristics. As a result, disadvantageously, the dark characteristic and the like may vary greatly between the pixel area 100 and the dummy pixel area 200.

In the present embodiment, the via hole is formed in the cap layer 25 and the interlayer insulating film 31, and the dummy via wire 33 is formed in the via hole. Moreover, the part of the cap layer 35 which is located over the copper wire 34 connected to the dummy via wire 33 (the part of the cap layer 35 which is located above the dummy via wire 33) is removed. This allows a diffusion path for hydrogen to be reliably provided. Furthermore, hydrogen diffuses more easily through the dummy via wire formed of metal than through the interlayer insulating film 31 formed of a silicon oxide film or the like. Thus, also in this connection, hydrogen can be reliably diffused. Hence, the amount of hydrogen supplied to the surface of the semiconductor substrate is prevented from differing significantly between the pixel area 100 and the dummy pixel area 200. This allows the dark characteristic and the like to be restrained from varying between the pixel area 100 and the dummy pixel area 200. Therefore, an excellent semiconductor image pickup device can be obtained.

After the sinter process ends, a color filter 45 is formed on the silicon nitride film 42. A micro lens 46 is formed on the color filter 45. Thus, the color filter 45 and the micro lens 46 are formed over the photodiode 13.

Thus, a semiconductor image pickup device configured as shown in FIG. 2 is formed.

As described above, in the present embodiment, the dummy via wire 33 penetrating the cap layer 25 is provided in the dummy pixel area 200. Furthermore, the cap layer 35 formed on the interlayer insulating film 31 includes the opening formed above the dummy via wire 33. This configuration allows a diffusion path for hydrogen to be reliably provided during a sinter process. As a result, the characteristic difference between the pixel area 100 and the dummy pixel area 200 can be reduced, resulting in an excellent semiconductor image pickup device.

In the above-described embodiment, the non-pixel area is the dummy pixel area 200 by way of example. However, the non-pixel area may be the black reference area 300. Even in this case, effects similar to those of the above-described embodiment can be exerted. Of course, a configuration similar to that described above in the embodiment may be adopted for both the dummy pixel area 200 and the black reference area 300.

Furthermore, in the above-described embodiment, the copper wire is used as the metal wire. However, if the cap layer needs to be provided to prevent diffusion of the metal contained in the metal wire, a configuration similar to that described above in the embodiment may be adopted even when the metal wire is formed of a metal other than copper.

Additionally, in the above-described embodiment, the silicon nitride film or silicon carbide film is used as the cap layer. However, a configuration similar to that described above in the embodiment may be adopted even if the cap layer is other than the silicon nitride film or silicon carbide film, provided that the cap layer suppresses diffusion of the metal used for the metal wire and prevents diffusion of hydrogen during the sinter process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor image pickup device comprising a pixel area including a plurality of pixels arranged in a matrix and a dummy pixel area arranged outside the pixel area, the device comprising:

a semiconductor substrate;

a first photoelectric conversion element formed in the pixel area on the semiconductor substrate;

a first transistor formed in the pixel area and connected to the first photoelectric conversion element;

a second photoelectric conversion element formed in the dummy pixel area on the semiconductor substrate;

a second transistor formed in the pixel area and connected to the first photoelectric conversion element;

a first interlayer insulating film formed on the semiconductor substrate;

a metal contact formed through the first interlayer insulating film and in contact with the semiconductor substrate;

a first metal wire formed on the first interlayer insulating film and connected to the metal contact;

a second interlayer insulating film formed on the first metal wire;

a dummy via wire formed in the dummy pixel area, formed directly above and to face the dummy pixel area, penetrating the second interlayer insulating film, and connected to the first metal wire; and a second metal wire formed over the dummy via wire and connected to an upper end of the dummy via wire.

2. The device according to claim 1, further comprising a first cap layer formed on the first metal wire to prevent diffusion of metal contained in the first metal wire, wherein the first metal wire and the first cap layer are not formed over the first photoelectric conversion element.

3. The device according to claim 2,
   wherein the dummy via wire is formed in a via hole formed in the first cap layer and the second interlayer insulating film.

4. The device according to claim 3, further comprising a second cap layer formed on the second interlayer insulating film and comprising an opening over the dummy via wire.

5. The device according to claim 4, wherein the second cap layer is not formed above the first photoelectric conversion element.

6. The device according to claim 4, wherein the second cap layer is formed of a silicon nitride film or a silicon carbide film.

7. The device according to claim 3, wherein each of the first and second interlayer insulating films is formed of a silicon oxide film.

8. The device according to claim 3, wherein the first cap layer is formed of a silicon nitride film or a silicon carbide film.

9. The device according to claim 1, wherein the first metal wire is formed of copper.

10. The device according to claim 1, wherein the dummy via wire is formed of copper.

11. The device according to claim 1, wherein the dummy via wire is not used for a circuit operation.

* * * * *